(12) United States Patent
Hsiao et al.

(10) Patent No.: US 9,287,139 B2
(45) Date of Patent: Mar. 15, 2016

(54) RE-CRYSTALLIZATION FOR BOOSTING STRESS IN MOS DEVICE

(71) Applicant: Taiwan Semiconductor Manufacturing Company, Ltd., Hsin-Chu (TW)

(72) Inventors: Ru-Shang Hsiao, Jhubei (TW); Cing-Yao Chan, Keelung (TW); Chun-Ying Wang, Tainan (TW); Jen-Pan Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 52 days.

(21) Appl. No.: 14/186,384

(22) Filed: Feb. 21, 2014

(65) Prior Publication Data

US 2015/0243526 A1 Aug. 27, 2015

(51) Int. Cl.
| | |
|---|---|
| *H01L 21/324* | (2006.01) |
| *H01L 29/66* | (2006.01) |
| *H01L 21/265* | (2006.01) |
| *H01L 29/78* | (2006.01) |

(52) U.S. Cl.
CPC ............ *H01L 21/324* (2013.01); *H01L 21/265* (2013.01); *H01L 29/66477* (2013.01); *H01L 29/7847* (2013.01)

(58) Field of Classification Search
None
See application file for complete search history.

(56) References Cited

U.S. PATENT DOCUMENTS

| | | | | |
|---|---|---|---|---|
| 6,709,935 | B1 * | 3/2004 | Yu .................................. | 438/289 |
| 6,916,694 | B2 * | 7/2005 | Hanafi ................ | H01L 29/7842 |
| | | | | 257/E21.438 |
| 2011/0227144 | A1 * | 9/2011 | Yin et al. ....................... | 257/327 |
| 2012/0264262 | A1 * | 10/2012 | Zhu et al. ....................... | 438/197 |
| 2013/0099294 | A1 * | 4/2013 | Lu et al. ......................... | 257/288 |

* cited by examiner

*Primary Examiner* — Charles Garber
*Assistant Examiner* — Brigitte Paterson
(74) *Attorney, Agent, or Firm* — Slater & Matsil, L.L.P.

(57) ABSTRACT

A method includes forming a dummy gate stack over a semiconductor substrate, removing the dummy gate stack to form a recess, and implanting a portion of the semiconductor substrate through the recess. During the implantation, an amorphous region is formed from the portion of the semiconductor substrate. The method further includes forming a strained capping layer, wherein the strained capping layer extends into the recess. An annealing is performed on the amorphous region to re-crystallize the amorphous region. The strained capping layer is then removed.

20 Claims, 6 Drawing Sheets

RE-CRYSTALLIZATION FOR BOOSTING STRESS IN MOS DEVICE

BACKGROUND

To enhance the performance of Metal-Oxide-Semiconductor (MOS) devices, stress may be introduced in the channel regions of the MOS devices to improve carrier mobility. Generally, it is desirable to induce a tensile stress in the channel region of an N-type MOS ("NMOS") device in a source-to-drain direction of the NMOS device, and to induce a compressive stress in the channel region of a p-type MOS ("PMOS") device in a source-to-drain direction of the PMOS device.

A commonly used method for applying compressive stresses to the channel regions of PMOS devices is growing SiGe stressors in the source and drain regions of the of the PMOS devices. Such a method typically includes the steps of forming a gate stack on a silicon substrate, forming spacers on sidewalls of the gate stack, forming recesses in the silicon substrate and adjacent to the gate spacers, and epitaxially growing SiGe stressors in the recesses. An annealing is then performed. Since SiGe has a greater lattice constant than silicon, it expands after annealing and applies a compressive stress to the channel region of the respective MOS device, which is located between a source SiGe stressor and a drain SiGe stressor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
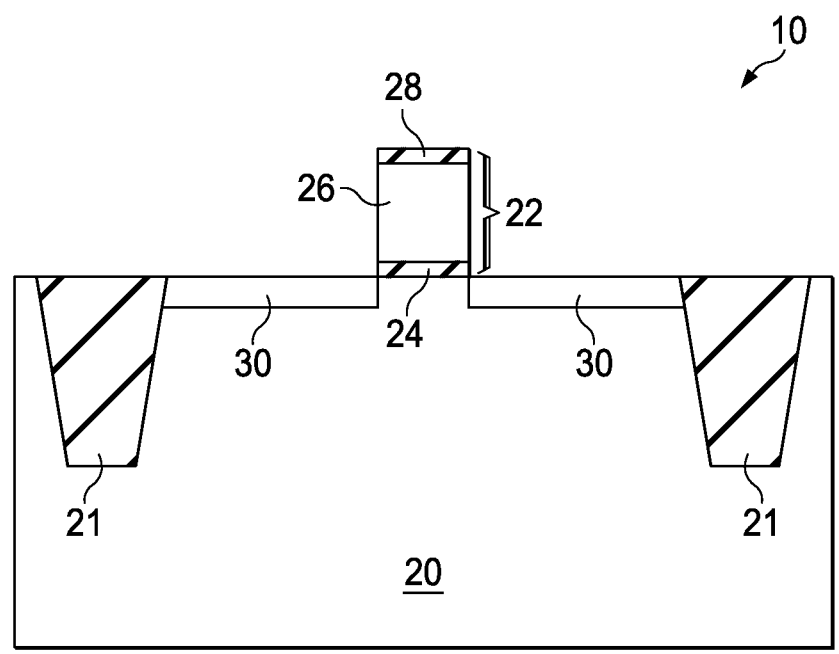
FIGS. 1 through 12 illustrate the cross-sectional views of intermediate stages in the formation of a Metal-Oxide-Semiconductor (MOS) device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Metal-Oxide-Semiconductor (MOS) device and the method of forming the same are provided in accordance with various exemplary embodiments. The intermediate stages of forming the MOS device are illustrated. The variations of the embodiments are discussed. Throughout the various views and illustrative embodiments, like reference numbers are used to designate like elements.

FIGS. 1 through 12 are cross-sectional views of intermediate stages in the formation of a MOS device in accordance with some exemplary embodiments. Referring to FIG. 1, wafer 10, which comprises substrate 20, is provided. Substrate 20 may be formed of a semiconductor material such as silicon, silicon carbon (SiC), silicon germanium (SiGe), an III-V compound semiconductor, or the like. Shallow Trench Isolation (STI) regions 21 are formed in substrate 20, and are used to define the active regions of MOS devices.

Dummy gate stack 22 is formed over substrate 20. Dummy gate stack 22 includes dummy gate dielectric 24 and dummy gate electrode 26. Dummy gate dielectric 24 includes silicon oxide in some exemplary embodiments. In alternative embodiments, other materials such as silicon nitride, silicon carbide, or the like, are also used. Dummy gate electrode 26 may include polysilicon. In some embodiments, dummy gate stacks 22 further includes hard mask 28 over dummy gate electrode 26. Hard mask 28 may comprise silicon nitride, for example, while other materials such as silicon carbide, silicon oxynitride, and the like may also be used. In alternative embodiments, hard mask 28 is not formed.

Figure 12:
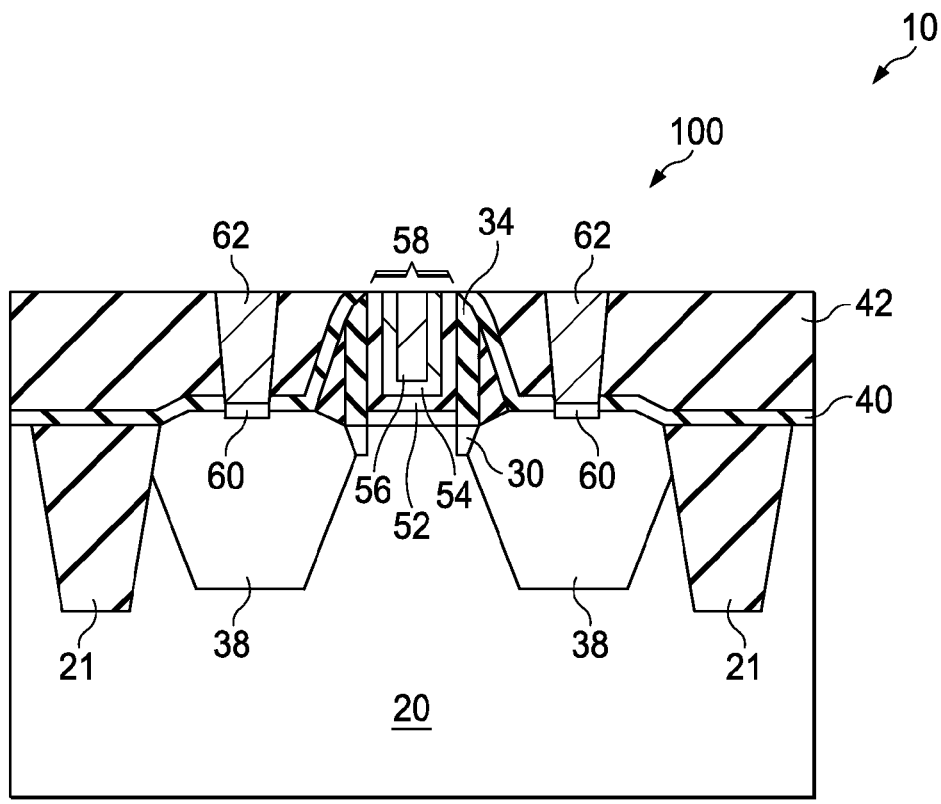

Lightly-Doped Drain/source (LDD) regions 30 are formed, for example, by implanting a p-type impurity (such as boron and/or indium) or an n-type impurity (such as phosphorous and/or arsenic) into substrate 20, depending on the conductivity type of the resulting MOS device 100 (FIG. 12). For example, when MOS device 100 is a pMOS device, LDD regions 30 are p-type regions. When the MOS device 100 is an nMOS device, LDD regions 30 are n-type regions. Dummy gate stacks 22 acts as an implantation mask, so that the edges of LDD regions 30 are substantially aligned with the edges of gate stacks 22.

Figure 2:
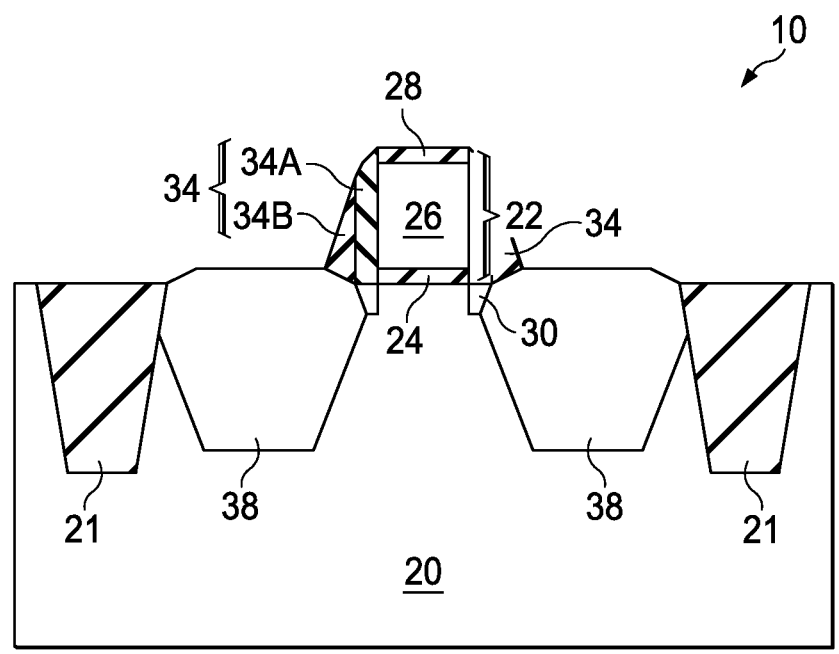

Referring to FIG. 2, gate spacers 34 are formed on the sidewalls of dummy gate stack 22. In some embodiments, each of gate spacers 34 includes silicon oxynitride layer 34A and silicon oxide layer 34B. In alternative embodiments, gate spacers 34 include one or more layers, each comprising silicon oxide, silicon nitride, silicon oxynitride, and/or other dielectric materials. The available formation methods include Plasma Enhanced Chemical Vapor Deposition (PECVD), Low-Pressure Chemical Vapor Deposition (LPCVD), Sub-Atmospheric Chemical Vapor Deposition (SACVD), and other deposition methods.

Source and drain regions (referred to as source/drain regions hereinafter) 38 are formed in semiconductor substrate 20. In the embodiments wherein MOS device 100 (FIG. 12) is a pMOS device, source/drain regions 38 are of p-type. In the embodiments wherein MOS device 100 is an nMOS device, source/drain regions 38 are of n-type. In some embodiments, source/drain stressors (also marked as 38) are formed in semiconductor substrate 20. The source/drain stressors form at least parts of source and drain regions 38. FIG. 2 illustrates the embodiments in which source/drain regions 38 fully overlap the respective source/drain stressors. In alternative embodiments, source/drain regions 38 and the source/drain stressors are partially overlapped.

Furthermore, in the embodiments in which MOS device 100 (FIG. 12) is an nMOS device, source/drain stressors 38 may comprise silicon phosphorous (SiP), silicon carbon (SiC), or the like. In the embodiments in which MOS device 100 is a pMOS device, source/drain stressors 38 may comprise silicon germanium (SiGe). The formation of source/drain stressors 38 may be achieved by etching semiconductor substrate 20 to form recesses therein, and then performing an epitaxy to grow source/drain stressors 38 in the recesses.

Figure 3:
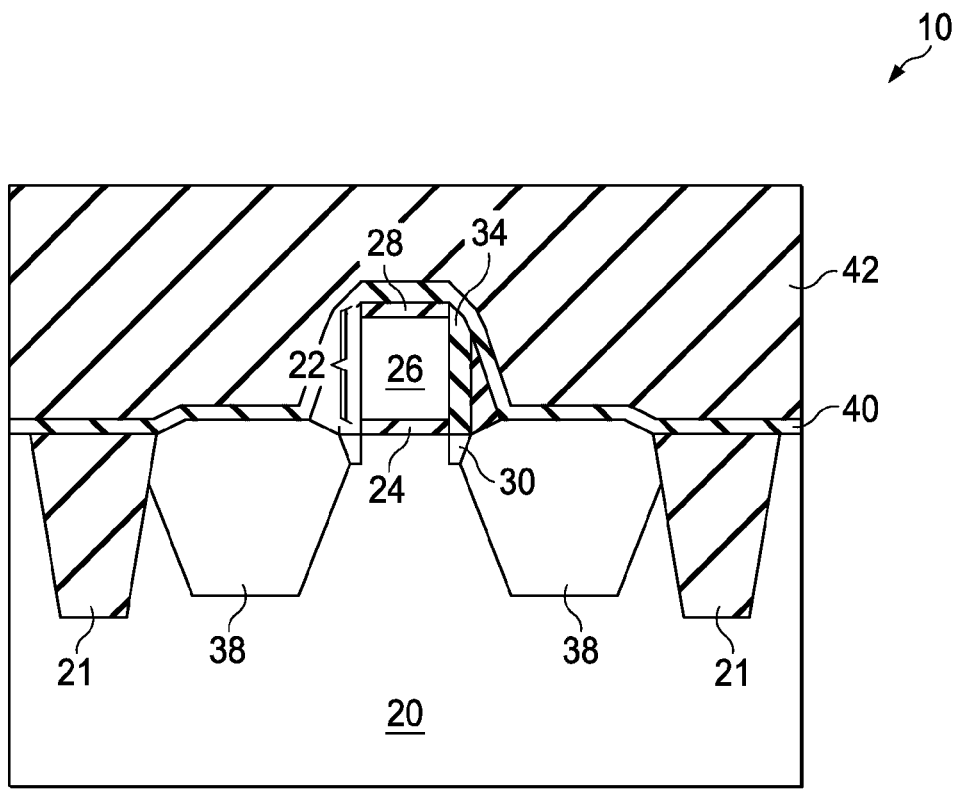

Referring to FIG. 3, Contact Etch Stop Layer (CESL) 40 is formed over gate stack 22 and source/drain regions 38. In some embodiments, CESL 40 comprises silicon nitride, silicon carbide, or other dielectric materials. Inter-Layer Dielectric (ILD) 42 is form over CESL 40. ILD 42 is blanket formed to a height higher than the top surface of dummy gate stack 22. ILD 42 may comprise Flowable oxide formed using, for example, Flowable Chemical Vapor Deposition (FCVD). ILD 42 may also be a spin-on glass formed using spin-on coating. For example, ILD 42 may comprise Phospho-Silicate Glass (PSG), Boro-Silicate Glass (BSG), Boron-Doped Phospho-Silicate Glass (BPSG), Tetraethyl Orthosilicate (TEOS) oxide, TiN, SiOC, or other low-k non-porous dielectric materials.

Figure 4:
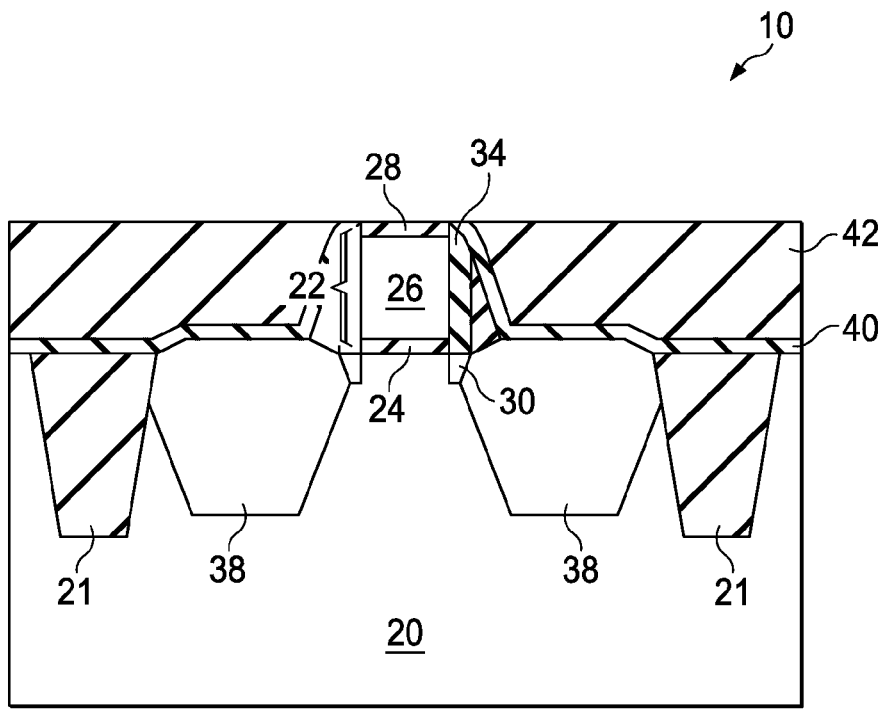

FIG. 4 illustrates a planarization step, which is formed using, for example, Chemical Mechanical Polish (CMP). The CMP is performed to remove excess portions of ILD 42 and CESL 40, wherein the excess portions are over the top surface of hard mask 28. Accordingly, dummy gate stack 22 is exposed. In alternative embodiments, hard mask 28 is removed during the CMP, wherein the CMP stops on the top surface of dummy gate electrode 26.

Figure 5:
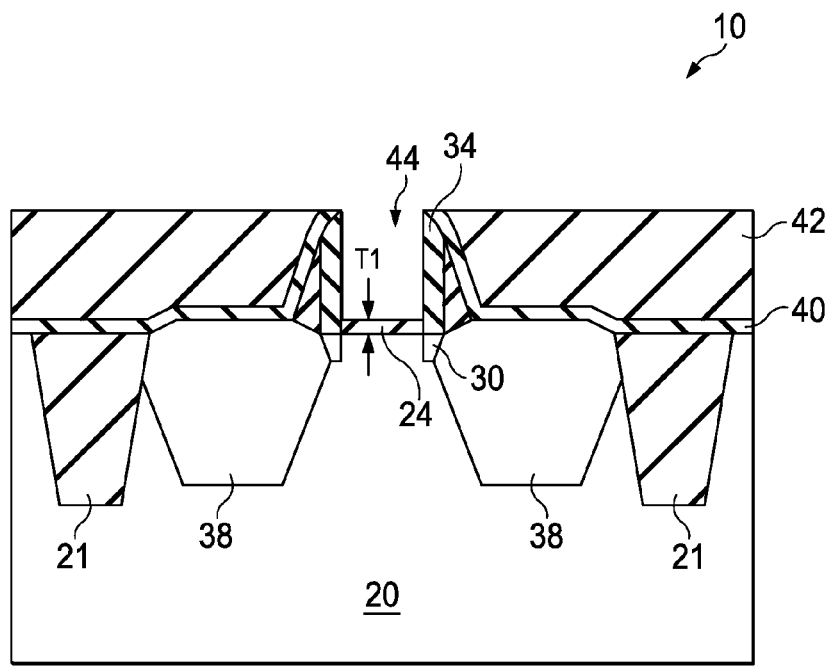

Next, dummy gate stack 22 is at least partially removed. For example, hard mask 28 (if not removed yet) and dummy gate electrode 26 are removed. Dummy gate dielectric 24 may be partially etched to remove its top portion, and a bottom portion of dummy gate dielectric 24 is left. Recess 44 is formed as a result of the removal of dummy gate stack 22, wherein the resulting structure is shown in FIG. 5. In some exemplary embodiments, thickness T1 of the remaining portion of dummy gate dielectric 24 is in the range between about 100 Å and about 200 Å. It is appreciated, however, that the values recited throughout the description are merely examples, and may be changed to different values.

Figure 6:
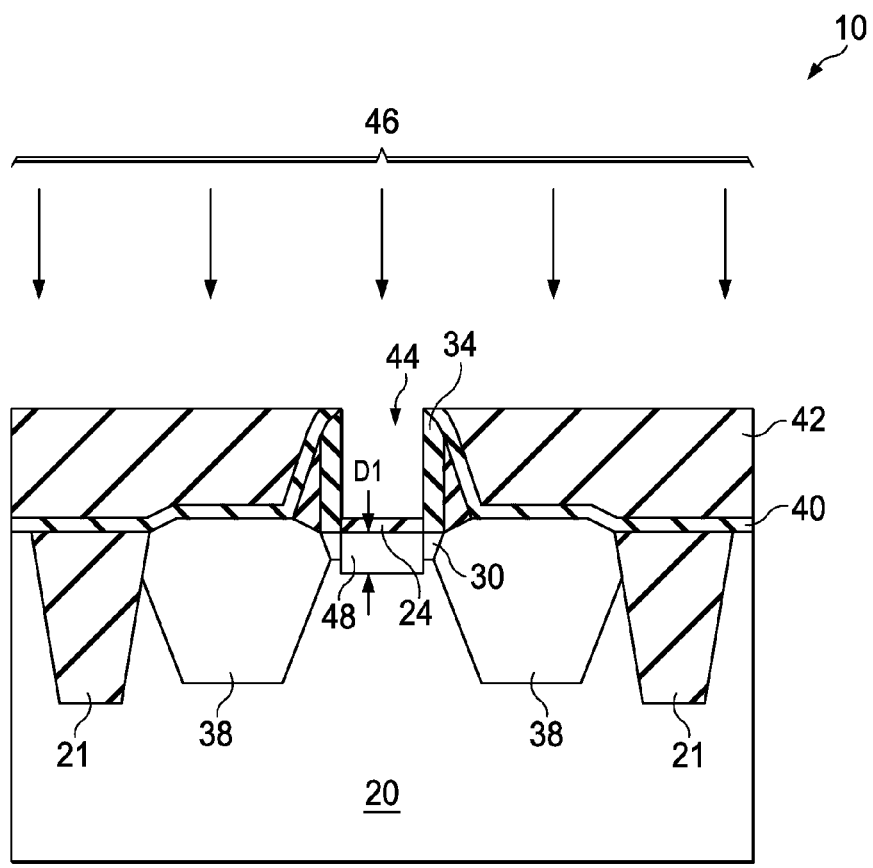

Referring to FIG. 6, an amorphization implantation 46 is performed. In some embodiment, silicon or germanium is implanted in the amorphization implantation. In other embodiments, an inert gas, which may be neon, argon, xenon, or radon, is implanted. The amorphization implantation destroys the lattice structure of a portion of semiconductor substrate 20. The amorphized portion of substrate 20 is directly underlying, and is overlapped by, recess 44. As a result, amorphous substrate region 48 is formed. On the other hand, source and drain regions 38 are protected by ILD 42, and are not implanted/amorphized.

In some embodiments, as shown in FIG. 6, the amorphization implantation is performed vertically. In alternative embodiment, the amorphization implantation is performed tilted, with the tilt angle smaller than about 30 degrees, for example. During the amorphization implantation, the remaining dummy gate dielectric 24 has the function of reducing the damage to substrate 20. Furthermore, the remaining dummy gate dielectric 24 may reduce the channeling effect of the implanted ions so that the implanted ions will not penetrate too deep into substrate 20 through the lattice spacing in substrate 20.

The depth D1 of the amorphous substrate region 48 is at least greater than the thickness of the channel of resulting MOS device 100 (FIG. 12). In some exemplary embodiments, depth D1 is greater than about 20 nm.

Figure 7:
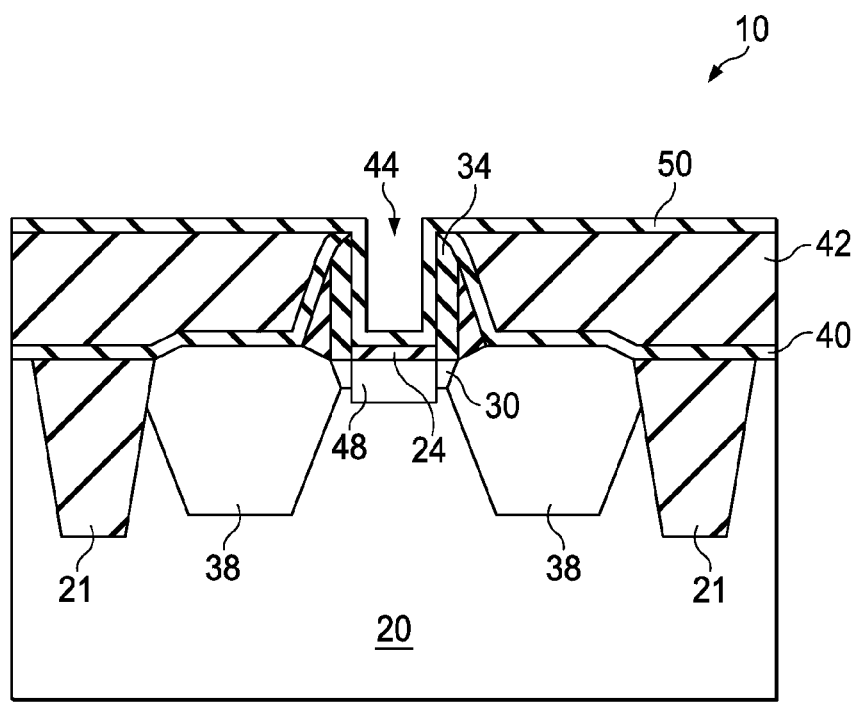

Referring to FIG. 7, strained capping layer 50 is formed on the structure shown in FIG. 6. Strained capping layer 50 further extends into recess 44, and is formed on the sidewalls of gate spacers 34, and over dummy gate dielectric 24. The materials of strained capping layer 50 may include silicon nitride, titanium nitride, oxynitride, oxide, SiGe, SiC, SiON, and/or combinations thereof. Strained capping layer 50 may have an inherent tensile stress or compressive stress. For example, when the resulting MOS device 100 (FIG. 12) is a p-type MOS device, strained capping layer 50 applies a compressive stress to the underlying regions including amorphous region 48. Conversely, when the resulting MOS device is an n-type MOS device, strained capping layer 50 applies a tensile stress to the underlying regions including amorphous region 48. The formation process of strained capping layer 50 is adjusted to tune the stress to a desirable value. In some embodiments, strained capping layer 50 includes a single layer. In other embodiments, strained capping layer 50 includes a plurality of sub layers. The formation methods may include ALD, CVD, PVD, or the like.

Figure 8:
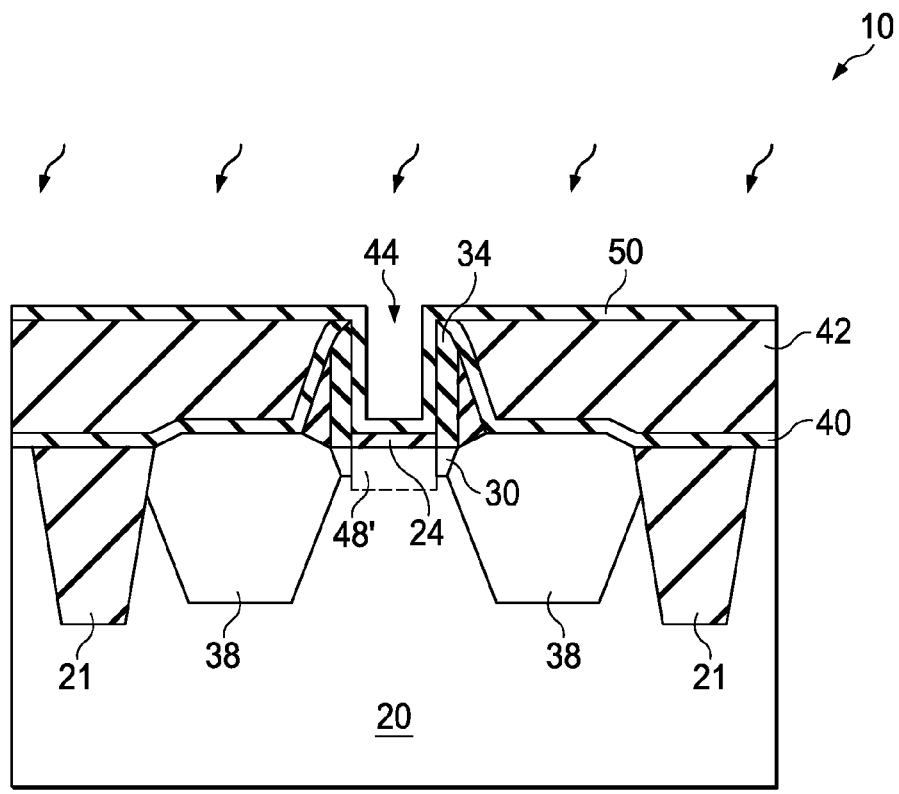

Referring to FIG. 8, an annealing (symbolized by arrows) is performed to re-crystallize amorphous region 48 (FIG. 7), so that the resulting region (marked as 48') has a crystalline structure again. The annealing may be performed using Rapid Thermal Anneal (RTA), laser anneal, spike anneal, or other applicable anneal methods. In some embodiment, the annealing is performed using spike RTA, with the annealing temperature between about 900° C. and about 1100° C., for example. As a result of the annealing, amorphous region 48 as in FIG. 7 is recrystallized, with a memorized stress obtained by re-crystallized region 48' from strained capping layer 50. For example, when the resulting MOS device 100 (FIG. 12) is a p-type MOS device, re-crystallized region 48' has an inherent memorized compressive stress. Conversely, when the resulting MOS device 100 is an n-type MOS device, re-crystallized region 48' has an inherent memorized tensile stress. A part of re-crystallized region 48' forms the channel of the resulting MOS device 100 (FIG. 12). Therefore, the stress in re-crystallized region 48' may improve the carrier mobility in the channel region, and may result in the improvement in the drive current of the MOS device.

Figure 9:
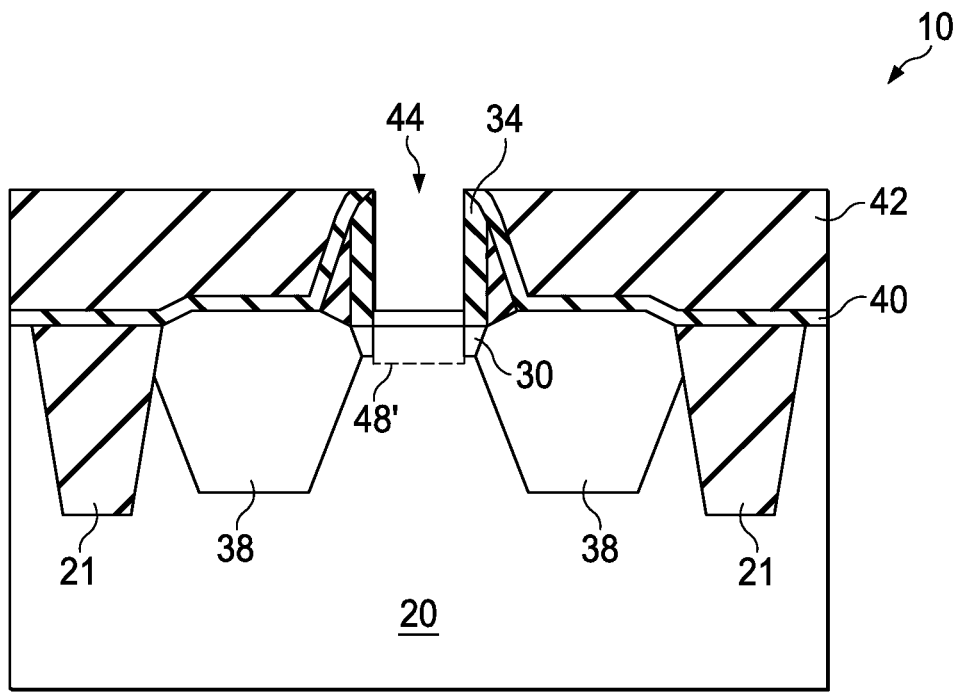

Next, an etch step is performed to remove strained capping layer 50. Subsequently, the remaining dummy gate dielectric layer 24 is removed, and hence re-crystallized region 48', which is a re-crystallized portion of the original substrate 20, is exposed through recess 44. The resulting structure is shown in FIG. 9.

Figure 10:
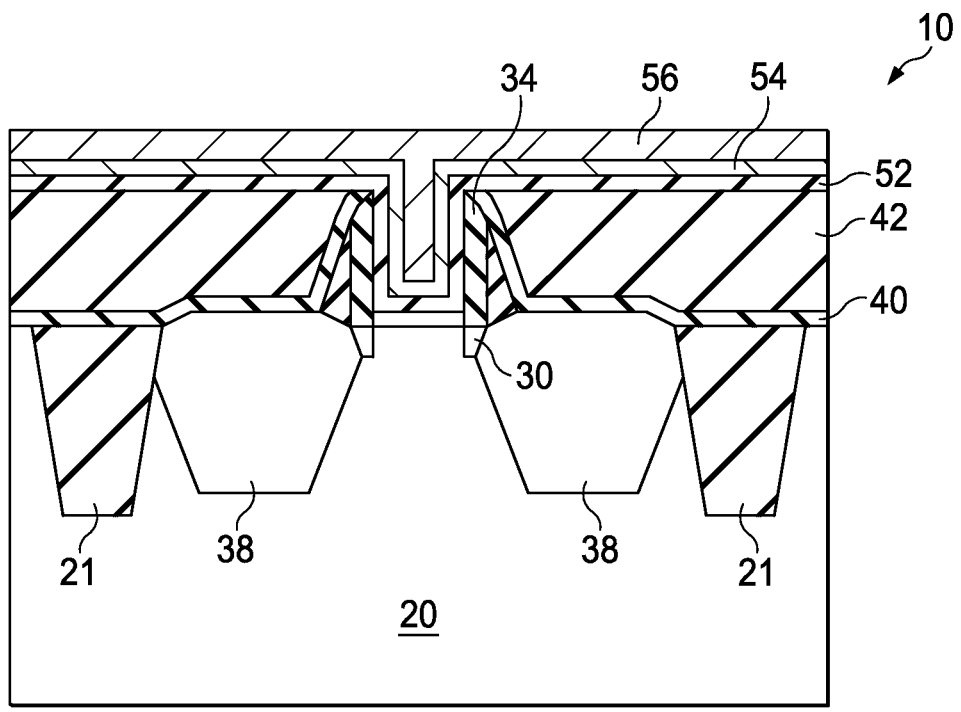
Figure 11:
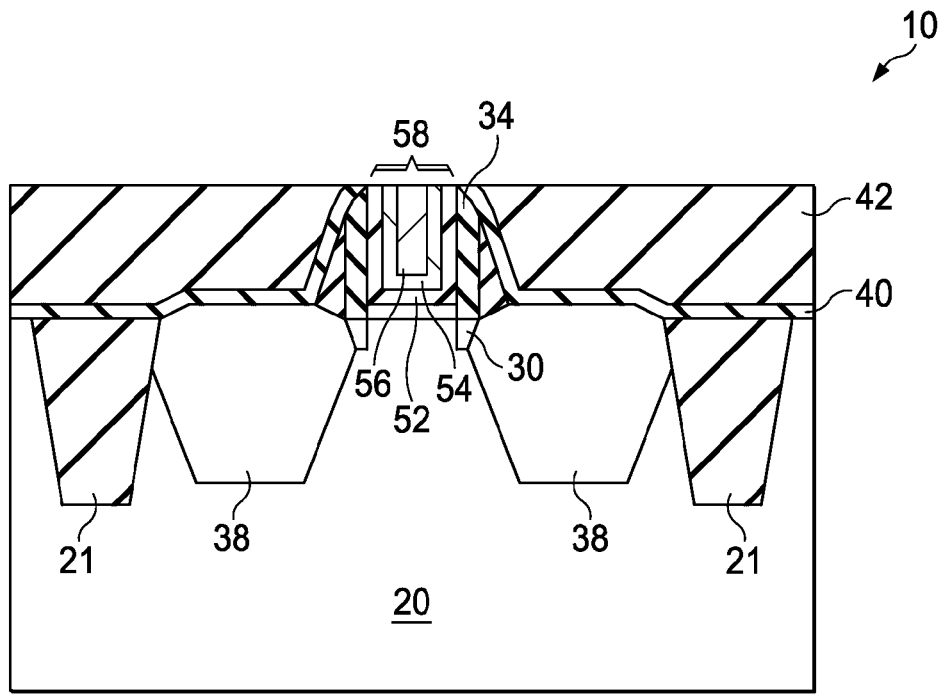

FIGS. 10 and 11 illustrate the formation of a replacement gate stack. Referring to FIG. 10, the replacement gate stack, which includes gate dielectric 52, metal layers 54, and filling metal 56, is formed. Metal layers 54 and filling metal 56 form a gate electrode. In some embodiments, gate dielectric 52 includes an interfacial dielectric such as silicon oxide, which may be formed through the thermal oxidation of substrate 20 or a deposition step. Gate dielectric 52 may also include a high-k dielectric layer (the upper part of gate dielectric layer 52) comprising a high-k dielectric material such as hafnium oxide, lanthanum oxide, aluminum oxide, or the like. The dielectric constant (k-value) of the high-k dielectric material is higher than 3.9, and may be higher than about 7.0, and sometimes as high as 21.0 or higher. The high-k dielectric layer is overlying, and may contact the interfacial dielectric.

A diffusion barrier/adhesion layer, which may include TiN, TaN, or composite layers thereof, may be formed as a bottom layer of metal layers 54. Metal layers 54 may also include a P-work-function metal layer or an N-work-function metal layer. For example, when MOS device 100 (FIG. 12) is an nMOS device, the N-work-function metal layer is formed, and the work function of the metal layers 54 may be lower than about 4.2 eV. The exemplary N-work-function metals include TiN, for example. When MOS device 100 is a pMOS device, the P-work-function metal is used, and the work function of the metal layers 54 may be higher than about 4.7 eV. The exemplary P-work-function metals include TaC, TiAl, Ti, TiAlN, TaSiN, TaCN, combinations thereof, and multilayers thereof.

Filling metal layer 56 may comprise aluminum, for example. The formation of layers 52, 54, and 56 may include Physical Vapor Deposition (PVD), Metal-Organic Chemical Vapor Deposition (MOCVD), and/or other applicable methods, depending on the materials of layers 52, 54, and 56.

FIG. 11 illustrates a planarization step (for example, a CMP step) for removing excess portions of layers 52, 54, and 56, wherein the excess portions are over ILD 42. The remaining portions of layers 52, 54, and 56 form replacement gate stack 58. Each of the remaining portions of layers 52, 54, and 56 includes a bottom portion, and sidewall portions over and connected to the bottom portion.

Referring to FIG. 12, source/drain silicide regions 60 and contact plugs 62 are formed. The formation process may include forming contact plug openings in ILD 42 to expose source/drain regions 38, forming a metal layer (not shown) to extend into the contact plug openings, performing an annealing to form the source/drain silicide regions 60, removing the un-reacted portions of the metal layer, and filling the contact plug openings to form contact plugs 62. MOS device 100 is thus formed.

The embodiments of the present disclosure have some advantageous features. By performing an amorphization implantation and then re-crystallizing the channel regions of the MOS devices, stresses are generated in the channel regions of the MOS devices. The carrier mobility in the channel regions is increased. The drive currents of the MOS devices are accordingly increased.

In accordance with some embodiments of the present disclosure, a method includes forming a dummy gate stack over a semiconductor substrate, removing the dummy gate stack to form a recess, and implanting a portion of the semiconductor substrate through the recess. During the implantation, an amorphous region is formed from the portion of the semiconductor substrate. The method further includes forming a strained capping layer, wherein the strained capping layer extends into the recess. An annealing is performed on the amorphous region to re-crystallize the amorphous region. The strained capping layer is then removed.

In accordance with alternative embodiments of the present disclosure, a method includes forming a dummy gate stack over a semiconductor substrate, removing the dummy gate stack to form a recess, and forming a source region and a drain region in the semiconductor substrate. The source region and the drain region are on opposite sides of the dummy gate stack. The method further includes implanting a portion of the semiconductor substrate through the recess to amorphize a portion of the semiconductor substrate. An amorphous region is formed from the portion of the semiconductor substrate. An annealing is performed on the amorphous region to re-crystallize the amorphous region.

In accordance with yet alternative embodiments of the present disclosure, a method includes forming a dummy gate stack over a semiconductor substrate, forming a source/drain region in the semiconductor substrate, wherein the source/drain region is adjacent to the dummy gate stack. The method further includes forming a contact etch stop layer overlying the dummy gate stack and the source/drain region, and forming an inter-layer dielectric over the contact etch stop layer. A chemical mechanical polish is performed to expose the dummy gate stack. In a subsequent step, the dummy gate stack to form a recess in the inter-layer dielectric. A portion of the semiconductor substrate is implanted through the recess, wherein an amorphous region is formed from the portion of the semiconductor substrate that is implanted. The method further includes forming a strained capping layer over the inter-layer dielectric, and then performing an annealing on the amorphous region to re-crystallize the amorphous region. After the annealing, the strained capping layer is removed. Next, a gate dielectric is formed in the recess. A gate electrode is formed in the recess, wherein the gate electrode is over the gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising: forming a dummy gate stack over a semiconductor substrate; removing the dummy gate stack thereby forming a recess; implanting a portion of the semiconductor substrate through the recess, wherein an amorphous region is formed from the portion of the semiconductor substrate; forming a strained capping layer, wherein the strained capping layer extends into the recess; performing an annealing on the amorphous region to re-crystallize the amorphous region; and then removing the strained capping layer.

2. The method of claim 1 further comprising, after the removing the strained capping layer:
   forming a gate dielectric in the recess; and
   forming a gate electrode in the recess, wherein the gate electrode is over the gate dielectric.

3. The method of claim 1, wherein the dummy gate stack comprises a dummy gate dielectric and a dummy gate electrode over the dummy gate dielectric, and wherein after the removing the dummy gate stack, a bottom portion of the dummy gate dielectric remains un-removed.

4. The method of claim 3 further comprising:
   after the annealing, removing the bottom portion of the dummy gate dielectric.

5. The method of claim 1 further comprising:
   forming a source/drain region adjacent to the dummy gate stack, wherein the source/drain region is of p-type, and wherein the strained capping layer applies a compressive stress to the portion of the semiconductor substrate.

6. The method of claim 1 further comprising:
   forming a source/drain region adjacent to the dummy gate stack, wherein the source/drain region is of n-type, and wherein the strained capping layer applies a tensile stress to the portion of the semiconductor substrate.

7. The method of claim 1 further comprising:
   forming a contact etch stop layer overlying the dummy gate stack;
   forming an inter-layer dielectric over the contact etch stop layer; and performing a planarization to remove portions of the contact etch stop layer and the inter-layer dielectric over the dummy gate stack.

8. A method comprising: forming a dummy gate stack over a semiconductor substrate; removing the dummy gate stack to form a recess; forming a source region and a drain region in the semiconductor substrate, wherein the source region and the drain region are on opposite sides of the dummy gate stack; implanting a portion of the semiconductor substrate through the recess to amorphize a portion of the semiconductor substrate, wherein an amorphous region is formed from the portion of the semiconductor substrate; forming a strained capping layer, wherein a portion of the strained capping layer extends into the recess, with a portion of the recess remaining after the strained capping layer is formed; performing an annealing on the amorphous region to re-crystallize the amorphous region; and then removing the strained capping layer.

9. The method of claim 8 further comprising: wherein the forming the strained capping layer is performed after the implanting and before the annealing.

10. The method of claim 9, wherein the source region and the drain region are of p-type, and wherein the strained capping layer applies a compressive stress to the amorphous region.

11. The method of claim 9, wherein the source region and the drain region are of n-type, and wherein the strained capping layer applies a tensile stress to the amorphous region.

12. The method of claim 8, wherein the dummy gate stack comprises a dummy gate dielectric and a dummy gate electrode over the dummy gate dielectric, and wherein in the removing the dummy gate stack, a bottom portion of the dummy gate dielectric remains un-removed.

13. The method of claim 12 further comprising:
after the annealing, removing the bottom portion of the dummy gate dielectric.

14. A method comprising:
forming a dummy gate stack over a semiconductor substrate;
forming a source/drain region in the semiconductor substrate, wherein the source/drain region is adjacent to the dummy gate stack;
forming a contact etch stop layer overlying the dummy gate stack and the source/drain region;
forming an inter-layer dielectric over the contact etch stop layer;
performing a chemical mechanical polish to expose the dummy gate stack;
removing the dummy gate stack to form a recess in the inter-layer dielectric;
implanting a portion of the semiconductor substrate through the recess, wherein an amorphous region is formed from the portion of the semiconductor substrate;
forming a strained capping layer over the inter-layer dielectric;
performing an annealing on the amorphous region to re-crystallize the amorphous region;
after the annealing, removing the strained capping layer;
forming a gate dielectric in the recess; and
forming a gate electrode in the recess, wherein the gate electrode is over the gate dielectric.

15. The method of claim 14, wherein the source/drain region is of p-type, and wherein the strained capping layer applies a compressive stress to the amorphous region.

16. The method of claim 14, wherein the source/drain region is of n-type, and wherein the strained capping layer applies a tensile stress to the portion of the semiconductor substrate.

17. The method of claim 14, wherein the dummy gate stack comprises a dummy gate dielectric and a dummy gate electrode over the dummy gate dielectric, and wherein in the removing the dummy gate stack, a bottom portion of the dummy gate dielectric remains un-removed.

18. The method of claim 14, wherein the strained capping layer extends into the recess.

19. The method of claim 1, wherein the strained capping layer fills the recess partially.

20. The method of claim 14, wherein the strained capping layer extends to a bottom and sidewalls of the recess, and wherein a top portion of the recess is unfilled with the strained capping layer.

* * * * *